THERMOELEMENTS AND DEVICES EMBODYING THEM
Filed April 16, 1957
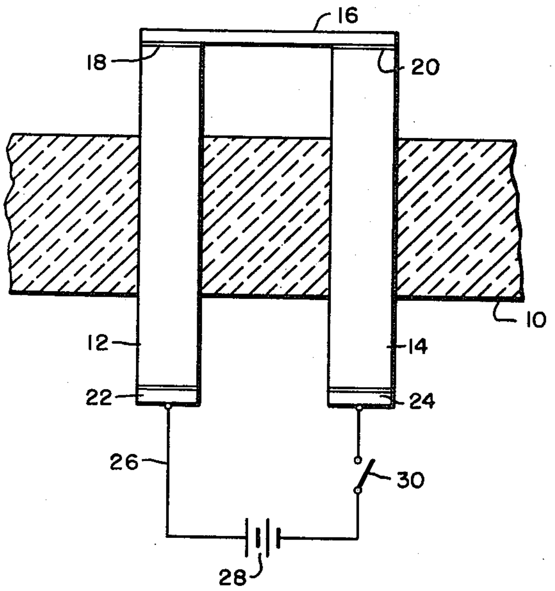
WITNESSES:
Bernard R. Gieguez
Robert C. Baird
INVENTORS
Robert R. Heikes and
William D. Johnston.
BY
Frederick Shapoe
ATTORNEY 2,921,973
Patented Jan. 19, 1960

2,921,973

THERMOELEMENTS AND DEVICES EMBODYING THEM

Robert R. Heikes, Wilkinsburg, and William D. Johnston, North Versailles Township, Allegheny County, Pa., assignors to Westinghouse Electric Corporation, East Pittsburgh, Pa., a corporation of Pennsylvania Application April 16, 1957, Serial No. 653,245
8 Claims. (Cl. 136—5)

The present invention relates to thermoelements and thermoelectric devices embodying the same.

It has been regarded as highly desirable to produce thermoelectric devices wherein either an electric current is passed therethrough whereby to provide for cooling applications or alternatively a source of heat is applied to one junction of the thermoelectric device whereby an electrical voltage is generated. For refrigeration applications in particular, one junction of the thermoelectric device is disposed within an insulated chamber and electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

Previously available materials for thermoelectric devices have been experimented with extensively. The best possible combinations of materials known heretofore have been inefficient and relatively unsatisfactory for one or more of the following reasons:

(1) The maximum verified temperature drop in the cold junction of the thermoelement is approximately 32.5° C.—such temperature drop is inadequate for most practical refrigeration apparatus.

(2) The efficiency of the thermoelectric device based on the electrical energy supplied thereto is quite low, at best amounting to approximately ¼ of the efficiency obtainable with a common compression refrigeration unit.

The passage of an electrical current through a thermoelectric device results in the absorption of heat at one junction and evolution of heat at the other junction thereof. In addition thereto, the passage of an electrical current through the elements produces Joule heat which is proportional to the second power of the electrical current flowing therethrough. Any heat generated in the thermoelements will flow toward the cold junction as well as toward the hot junction of the thermoelectric device. The electrical resistivity of the thermoelement members of the device and the thermal conductivity should be as small as possible.

Thermoelectric devices may be tested and the figure of merit may be computed from the test data. The higher the figure of merit the more efficient is the thermoelectric device. The figure of merit M for a thermoelement member may be defined as follows:

$$(1) \qquad M=\frac{T(\pi/T)^2}{4Kp}$$

where T is the absolute temperature, $\pi$ is the Peltier coefficient in calories per coulomb for the thermoelement, $p$ is the electrical restivity, and K is the thermal conductivity for the thermoelement member. Where two thermoelement members having differing resistances and thermal conductivities and Peltier coefficients are employed in pairs, the figure of merit of the combination may be computed from the following equation:

$$(2) \qquad M=\frac{T(V_1+V_2)^2}{4(\sqrt{P_1K_1}+\sqrt{P_2K_2})^2}$$

in which $P_1$ and $P_2$ are the electrical restivity of each of the thermoelement members. V is the thermoelectric power in volts per ° C., K is in watts/per cm./deg. C and P is in ohm centimeters.

For the best presently available thermoelectric elements the figure of merit is approximately 0.1, and for the vast majority of thermoelectric elements it is substantially below 0.1. Commercially acceptable thermoelectric elements should have a figure of merit of M equal to at least 0.3 and preferably 0.5 and higher. While in substantially all ordinary metals the product of PK is reasonably small, V is of the order of 30 microvolts per ° C. and as a consequence the figure of merit is much less than 0.1.

This invention is directed to the preparation of mixed valence inorganic compounds having relatively low PK coefficients and having a thermoelectric power V of the order of 500 to 1000 microvolts per ° C. The resistivity of this material is of the order of $10^{-2}$ ohms centimeters. The thermal conductivity is of the order of 0.02 watt per cm. per degree C.

The object of this invention is to provide thermoelectric devices comprising a thermoelement of which at least one member is a homogeneous solid of a mixed valence transition metal chalcogenide.

A further object of the invention is to provide thermoelectric devices embodying non-stoichiometric inorganic compounds suitable for use in thermoelectric devices having a high figure of merit.

Another object of the invention is to provide a thermoelectric device in which an inorganic compound forms one element and a metal forms the other element of a thermoelement pair.

Other objects of the invention will in part be obvious and will in part appear hereinafter. For a better understanding of the nature and objects of this invention, reference should be had to the following detailed description and drawing in which the single figure is a schematic view partly in cross section of a thermoelectric cooling device.

Highly useful thermoelements are mixed valence compounds having the formula $Li_mT_{(1-m)}X$ where T represents at least one transition metal from the group consisting of manganese, iron, nickel, cobalt, copper and zinc, X represents a chalcogenide from the group consisting of oxygen, sulfur, selenium and tellurium and $m$ has a value not exceeding 0.1 and not less than .001. When X represents oxygen, especially suitable transition metals are copper and zinc. The homogeneous solids of this formula may be employed as the positive element of a thermoelement pair.

A suitable negative element to cooperate with the positive element may be composed of a homogeneous solid having the formula $Al_nT_{(1-n)}X$, where T represents one or more transition metals, X has the value previously given and $n$ has a value of from 0.1 to 0.001. A specific composition of this compound has the formula $$Al_nCu_{(1-n-p)}Zn_pO$$

wherein $n$ has a value of from 0.1 to 0.001 and $p$ has a value not exceeding $(1-n)$.

Other suitable positive and negative thermoelement components may comprise compounds having the formula $MZ_{(1\pm a)}$ where M represents an element from the group consisting of chromium, iron, nickel, copper, cobalt and manganese and Z represents an element selected from the group consisting of sulfur, selenium, tellurium, arsenic, antimony and bismuth and $a$ has a positive value of less than 0.1.

When the compound has the formula $MZ_{(1+a)}$, homogeneous members thereof may function as the positive element. Conversely, when the inorganic compound has the formula $MZ_{(1-a)}$, homogeneous members thereof will function as the negative element. Thermoelement pairs may be prepared by employing members of from each of these groups and joining the terminals of a positive to a negative element. Furthermore members of the compound having the formula $MZ_{(1+a)}$ may be paired with members of the compound having the formula $$Al_nT_{(1-n)}X$$

to form satisfactory thermoelements. Members of the compound having the formula $MZ_{(1-a)}$ may be paired with members of the compound having formula $$Li_mT_{(1-m)}X$$

to provide satisfactory thermoelements. It will be understood that all of these inorganic compounds are homogeneous for the purpose of this invention.

It has been discovered that highly satisfactory thermoelements may be prepared by combining a metal member with a member of any of the homogeneous inorganic compounds, either positive or negative elements. Examples of suitable metals are copper, silver, copper base alloys, silver base alloys and molybdenum. Any metal which is solid under conditions of use and non-reactive with the inorganic compound or the atmosphere or surrounding medium can be employed in such thermoelement devices. Copper will give excellent results when associated with a member of the compounds $MZ_{(1\pm a)}$, $Li_nT_{(1-n)}X$ or $Al_nT_{(1-n)}X$.

Specific potentially useful thermoelement members may be prepared from compounds of chromium and manganese reacted with tellurium, arsenic, antimony and bismuth wherein there is either a slight excess or deficiency of tellurium, arsenic, antimony or bismuth over the metal cation. Examples of compounds of this type are chromium telluride, manganese arsenide, manganese telluride, manganese bismuthide and manganese antimonide. In all cases the anion preferably does not exceed 0.1 mol excess or deficiency. These non-stoichiometric compounds are readily prepared by admixing the manganese or chromium with the desired amount of the anion and firing the mixture within a protected atmosphere. The reaction product may be compressed into a pellet and sintered at elevated temperature to produce a relatively solid member.

The lithium substituted transition metal chalcogenides may be prepared as disclosed in our copending patent application Serial No. 580,856, filed April 26, 1956. Briefly this comprises preparing a transition metal oxide and then admixing it intimately with lithium peroxide. The intimate mixture compressed into a pellet is placed within a sealed container and heated to a temperature of from 600° C. to 1200° C. for a period of time to produce the desired lithium substituted transition metal compound.

A positive thermoelement member may be prepared by admixing finely divided copper oxide and zinc oxide in proportions providing 0.92 mol of zinc oxide and 0.07 mol of copper oxide, and 0.01 mol of lithium peroxide is added to this mixture. A pellet formed by compressing the mixture is placed within a sealed container of platinum and then heated at an elevated temperature of, for example, 900° C. for a period of several hours until a homogeneous reaction product is produced. The reaction product is in the form of a sintered pellet, which is inhomogeneous in density and has a relatively high internal resistance and consequently is not suitable for the purpose of producing satisfactory thermoelectric devices. This sintered pellet, therefore, is fused at an elevated temperature and recrystallized into a solid homogeneous body, preferably a single crystal, by withdrawing it at a slow rate from the furnace whereby during cooling controlled solidification results. Single crystals will have a resistivity of the order of 0.01 ohm-cm. The thermal conductivity of the sintered pellet is not significantly different from the thermal conductivity of the single crystal or other solid homogeneous body. Consequently the formation of a recrystallized or single crystal body results in a marked reduction of the factor PK. The resulting single crystal may be cut to produce a suitably shaped positive thermoelement member.

For a negative thermoelement member an alloy is prepared from aluminum and copper in an amount equal to less than 10 atom percent of the aluminum. The alloy may be in the form of thin sheets, powder, wire or the like. The alloy is then heated in an oxidizing atmosphere under conditions wherein oxidation proceeds very slowly. To this end the atmosphere may comprise a very low partial pressure of oxygen of the order of one micron or less, and the temperatures should be relatively low, for example, below 500° C. After several hours of oxidation under these conditions the oxygen partial pressure may be increased and the temperature raised whereby the entire aluminum-copper alloy is rapidly completely oxidized. Thereafter the resulting mixed oxide is crushed to a fine powder and sufficient zinc oxide added thereto to provide 1 to 10 mol percent of zinc oxide and from 0.1 to 10 mol percent of the aluminum, and not less than 80 mol percent of copper. This mixture of oxides is then melted and solidified to form a solid homogeneous member.

Referring to the figure of the drawing, there is illustrated a thermoelectric device suitable for effecting refrigeration. A thermally insulating wall 10 so formed as to provide a suitable chamber, is perforated to permit passsage therethrough of a positive thermoelement member 12 and a negative thermoelement member 14. An electrically conducting strip 16 of metal, for example, is joined to an end face 18 of the member 12 and end face 20 of the member 14 within the chamber so as to provide good electrical and thermal contact therewith. The end faces 18 and 20 may be coated with a thin layer of metal, for example, by vacuum evaporation or by use of ultrasonic brazing, whereby good electrical contact and thermal adherence thereto is obtained. The metal strip 16 of copper, silver or the like may be brazed or soldered to the metal coated end faces 18 and 20. The metal strip 16 may be provided with suitable fins or other means for conducting heat thereto from the chamber in which it is disposed. At the end of the member 12 located on the other side of wall 10 is attaced a metal plate or strip 22 by brazing or soldering in the same manner as was employed in attaching strip 16 to end face 18. Similarly a metal strip or plate 24 may be connected to the other end of member 14. The plates 22 and 24 may be provided with heat dissipating fins or other cooling means whereby heat generated thereat may be dissipated. An electrical conductor 26 attached to a source 28 of direct curent is affixed to the end plates 22 and 24. A switch 30 is interposed in the conductor 26 to enable the electrical circuit to be opened and closed as desired. When the switch 30 is moved to closed position, electrical current from the source 28 flows through the thermoelements 12 and 14 whereby cooling is effected within the metal strip 16 and heat is generated at plates 22 and 24.

It will be appreciated that a plurality of pairs of the positive and negative members may be joined in series in order to produce a plurality of cooperating thermoelements. The cold junctions of each of these joined thermoelements will be placed within a suitable chamber to be cooled while the hot junctions will be so disposed that they will reject heat to a suitable heat sink.

In a similar manner the thermoelements of the present invention may be disposed with one junction in a furnace or other source of heat while the other junction is cooled by applying water or blowing air thereon or the like. Due to the relative difference in the temperature of the junctions, an electrical voltage will be generated in the thermoelements. By joining a plurality of the thermoelements, direct current at any suitable voltage will be generated.

It will be apperciated that the above description and drawing are only exemplary and not exhaustive of the invention.

We claim as our invention:

1. A thermoelectric device comprising one member of a homogeneous solid having the formula $Li_mT_{(1-m)}X$ where T represents at least one transition metal from the group consisting of manganese, iron, nickel, cobalt, copper and zinc, X represents a chalcogenide from the group consisting of oxygen, sulfur, selenium and tellurium, and $m$ has a value not exceeding 0.1 and not less than 0.001 and another member electrically connected to one portion of the said one member, said another member composed of a homogeneous solid having the formula $Al_nT_{(1-n)}X$ where $n$ is from 0.1 to 0.001.

2. A thermoelectric device comprising one member of a homogeneous solid having the formula $$Li_nCu_{(1-n-p)}Zn_pO$$

where $n$ has a value of from 0.1 and 0.001, and $p$ has a positive value not exceeding $(1-n)$, and another member electrically connected to one portion of the said one member, said another member composed of a homogeneous solid having the formula $Al_nCu_{(1-n-p)}Zn_pO$ where $n$ has a value of from 0.1 to 0.001, and $p$ has a positive value not exceeding $(1-n)$.

3. A thermoelement device comprising a joined pair of members, one member being of a compound having the formula $MZ_{(1\pm a)}$ where M represents an element from the group consisting of chromium, iron, cobalt, nickel, copper and manganese, and Z represents an element selected from the group consisting of sulfur, selenium, tellurium, arsenic, antimony and bismuth, and $a$ has a value of less than 0.1 and other member being a solid metal.

4. A thermoelement member comprising a homogeneous solid having the formula $Al_nT_{(1-n)}X$ where T represents at least one transition metal from the group consisting of manganese, iron, nickel, cobalt, copper and zinc, X represents a chalcogenide from the group consisting of oxygen, sulfur, selenium and tellurium, and $n$ has a value of from 0.1 to 0.001.

5. A thermoelectric device comprising pairs of joined members of which one member of each pair is selected from the group consisting of homogeneous solid inorganic compounds having the formula $Li_mT_{(1-m)}X$ and $MZ_{(1+a)}$ where T represents at least one transition metal from the group consisting of manganese, iron, nickel, cobalt, copper and zinc, X represents a chalcogenide from the group consisting of oxygen, sulfur, selenium and tellurium, and $m$ has a value not exceeding 0.1 and not less than 0.001, where M represents an element from the group consisting of chromium, iron, cobalt, nickel, copper and manganese, and Z represents an element selected from the group consisting of sulfur, selenium, tellurium, arsenic, antimony and bismuth, and $a$ has a value of less than 0.1, and the other member is selected from the group consisting of $Al_nT_{(1-n)}X$ and $MZ_{(1-a)}$ where $n$ has a value of from 0.1 to 0.001.

6. A thermoelement device comprising pairs of joined members of which one member of each pair is selected from the group of homogenous solid inorganic compounds having the formula $Li_mT_{(1-m)}X$, $Al_nT_{(1-n)}X$ and $MZ_{(1\pm a)}$ where T represents at least one transition metal from the group consisting of manganese, iron, nickel, cobalt, copper and zinc, X represents a chalcogenide from the group consisting of oxygen, sulfur, selenium and tellurium, $m$ has a value not exceeding 0.1 and not less than 0.001, where M represents an element from the group consisting of chromium, iron, cobalt, nickel, copper and manganese, and Z represents an element selected from the group consisting of sulfur, selenium, tellurium, arsenic, antimony and bismuth, $a$ has a value of less than 0.1, and $n$ has a value of from 0.1 to 0.001, and the other member is a solid metal.

7. The thermoelement device of claim 6 wherein the metal is selected from the group consisting of copper, silver, copper base alloys, silver base alloys and molybdenum.

8. A thermoelectric device comprising a joined pair of members, one member comprising a compound having the formula $MZ_{(1\pm a)}$ where M represents an element from the group consisting of chromium, iron, cobalt, nickel, copper and manganese, and Z represents an element selected from the group consisting of sulfur, selenium, tellurium, arsenic, antimony and bismuth, and $a$ has a value of from 0.1 to 0.001, and the other member having the opposite sign of thermoelectric power from the said one member.

References Cited in the file of this patent

UNITED STATES PATENTS

| | | |
|---|---|---|
| 286,288 | Frasch | Oct. 9, 1883 |
| 685,471 | Hermite et al. | Oct. 29, 1901 |
| 775,188 | Lyons et al. | Nov. 15, 1904 |
| 2,232,960 | Milnes | Feb. 25, 1941 |
| 2,397,756 | Schwarz | Apr. 2, 1946 |
| 2,602,095 | Faus | July 1, 1952 |
| 2,685,608 | Justi | Aug. 3, 1954 |

OTHER REFERENCES

Journal of Applied Physics, vol. 18, No. 6, December 1947, pp. 1124–1125.